United States Patent
Holzner et al.

(10) Patent No.: US 12,308,340 B2
(45) Date of Patent: May 20, 2025

(54) THERMOCOMPRESSION APPARATUS AND METHOD FOR BONDING ELECTRICAL COMPONENTS TO A SUBSTRATE

(71) Applicant: MB AUTOMATION Gmbh & Co. KG, Roding (DE)

(72) Inventors: Benjamin Holzner, Oberviechtach (DE); Uwe Franz Augst, Wackersdorf (DE)

(73) Assignee: MB AUTOMATION GmbH & Co. KG, Roding (DE)

( * ) Notice: Subject to any disclaimer, the term of this patent is extended or adjusted under 35 U.S.C. 154(b) by 9 days.

(21) Appl. No.: 18/254,633

(22) PCT Filed: Oct. 22, 2021

(86) PCT No.: PCT/EP2021/079313
§ 371 (c)(1),
(2) Date: May 26, 2023

(87) PCT Pub. No.: WO2022/111917
PCT Pub. Date: Jun. 2, 2022

(65) Prior Publication Data
US 2024/0421118 A1     Dec. 19, 2024

(30) Foreign Application Priority Data
Nov. 26, 2020   (DE) .................... 10 2020 007 235.6

(51) Int. Cl.
*H01L 21/00*   (2006.01)
*H01L 23/00*   (2006.01)

(52) U.S. Cl.
CPC .... *H01L 24/75* (2013.01); *H01L 2224/45301* (2013.01); *H01L 2224/75251* (2013.01);
(Continued)

(58) Field of Classification Search
CPC ...................................................... H01L 24/75
See application file for complete search history.

(56) References Cited

U.S. PATENT DOCUMENTS

| | | |
|---|---|---|
| 5,573,170 A | 11/1996 | Sasaki et al. |
| 6,015,081 A | 1/2000 | Okabayashi et al. |

(Continued)

FOREIGN PATENT DOCUMENTS

| | | |
|---|---|---|
| DE | 102012012879 B3 | 9/2013 |
| EP | 1780782 A1 | 5/2007 |

(Continued)

*Primary Examiner* — Jeffry H Aftergut
(74) *Attorney, Agent, or Firm* — John A. Miller; Shumaker, Loop & Kendrick, LLP

(57) ABSTRACT

A thermocompression apparatus for connecting electrical components to a substrate, with a lower tool with a bearing surface for placing the substrate with at least one electrical component arranged thereon and an upper tool with a pressing element facing the bearing surface of the lower tool. The lower tool and/or the upper tool perform an up/down movement by a first drive and a second drive. The first drive is set up to execute a first movement in a first speed range and a first stroke range. The second drive is arranged to perform a second movement in a second speed range and a second stroke range. A thermode assembly is arranged to feed heating energy into the component and/or the substrate in order to thermally cure an adhesive introduced between or located on the component and the substrate.

25 Claims, 3 Drawing Sheets

(52) U.S. Cl.
CPC .......... *H01L 2224/7555* (2013.01); *H01L 2224/7592* (2013.01)

(56) References Cited

U.S. PATENT DOCUMENTS

| | | |
|---|---|---|
| 2007/0023478 A1 | 2/2007 | Levannier et al. |
| 2009/0289098 A1 | 11/2009 | Terada et al. |
| 2009/0291524 A1 | 11/2009 | Takahashi |
| 2010/0024667 A1 | 2/2010 | Ikura |
| 2016/0029494 A1 | 1/2016 | Hojo et al. |

FOREIGN PATENT DOCUMENTS

| | | | |
|---|---|---|---|
| EP | 2506295 A2 | | 10/2012 |
| GB | 2047596 A | * | 12/1980 |
| JP | H-03225842 A | | 10/1991 |
| WO | 0041219 A1 | | 7/2000 |
| WO | 2010095311 A1 | | 8/2010 |
| WO | 2016192926 A1 | | 12/2016 |

\* cited by examiner

THERMOCOMPRESSION APPARATUS AND METHOD FOR BONDING ELECTRICAL COMPONENTS TO A SUBSTRATE

CROSS-REFERENCE TO RELATED APPLICATIONS

This application is a National Stage application of International Application No. PCT/EP2021/079313 filed Oct. 22, 2021, which claims priority to German Patent Application Serial No. DE 10 2020 007 235.6 filed Nov. 26, 2020.

BACKGROUND

Field

A thermocompression apparatus and method for bonding electrical components to a substrate is described herein. In particular, it is described here how an electrical component is pressed against the substrate for the duration of a curing process of an adhesive. In the manufacture of smart cards or RFID (Radio Frequency IDentification) labels, thermocompression processes are used to mechanically (and electrically conductively) connect electrical components to a substrate. Such processes are used in particular to connect semiconductor chips in flip-chip design to a substrate.

Discussion of the Related Art

Thermocompression describes a joining process in which components are joined together by a temporary application of force and heat. Thermocompression apparatuses for connecting electrical components to a substrate are known from the prior art.

An adhesive deposit located between the electronic component and the substrate is cured with a defined temperature-time profile. During the temperature-time profile, the electronic component is pressed against the substrate. For industrial bonding of components, such thermode assemblies usually operate in an operating temperature range of <250° C. and process times >1 second up to <10 seconds. These two process parameters are controlled by a (temperature) sensor and by the mechanical movement over time, respectively. In some arrangements, the contact pressure or the contact force is metrologically checked and adjusted during an adjustment phase of the arrangement prior to production operation of the arrangement. For this purpose, a force measuring sensor is temporarily inserted into the working path of a thermode assembly.

Such apparatuses are disclosed, for example, by Tag Module Assembly (TMA) Lines, in which a substrate with electrical components placed on it is continuously moved between two pressing heating rails. In this process, relative movement may occur between the components to be connected and the heating rails, but this may have an effect on the positioning accuracy. Therefore, such a setup is used to manufacture products with larger positioning tolerances.

DE 10 2012 012 879 B3 describes a thermocompression apparatus for joining electrical components to a substrate. The apparatus has rollers over which the substrate is guided. A drive roller serves to convey the substrate step by step. Furthermore, the apparatus has a support for the substrate, a steel foil serving as a pressure band, and magnets by which the pressure band is attracted so that it presses the electrical components onto the substrate. A heating rail is attached to the support. The apparatus further comprises a lifting unit to which the pressure band is attached and which is adapted to be raised and lowered relative to the support. A radiant heater is attached to the lifting unit. In operation, the substrate with a liquid bonding agent and the electrical components is conveyed between the support and the pressure belt. The lifting unit is then lowered so that the pressure belt presses the electrical components against the substrate by the action of the magnets. To cure the bonding agent, heat is supplied by the heating rail and the radiant heater. The apparatus can be manufactured inexpensively and the electrical components can be pressed onto the substrate with a defined force.

However, neither the heating rail nor the radiant heater have direct contact with the substrate and the electrical components during operation. In particular, the radiant heater attached to the lifting unit emits heat in the form of thermal radiation, which then only heats up the printing ribbon after it has reached the substrate. Due to the heating rays, it thus takes some time for the pressure band to heat up to a certain temperature suitable for curing the fastener. This limits the throughput that can be achieved with the apparatus.

EP 1 780 782 A1 describes an apparatus for chip production in which a chip and a substrate are connected in a continuous process by means of pressure and heat supply. The pressure is caused by magnetic forces. The heat is supplied by hot compressed air, which is directed onto the substrate via nozzles. The use of heating stamp units is also known for applying force and heat to the components to be connected. For example, EP 2 506 295 A2 and JP H-03225842 (A) disclose apparatuses in which a substrate and a plurality of semiconductor chips arranged thereon rest on a support plate and are joined by means of a heating stamp unit. The heating plunger unit exerts a force on the components to be connected so that they are pressed against the holding plate. Furthermore, a heat source in the heating plunger provides heat to cure an adhesive applied between the substrate and the semiconductor chips.

For the production of electronic assemblies with a thermoset layer, US 2009/0291524 A1 and WO 2010/095311 A1 further disclose thermocompression apparatuses with heating stamp units. The assemblies to be produced comprise a substrate with semiconductor chips arranged thereon, over which the thermoset layer extends. The heating plunger unit causes the components of the electronic assembly to be subjected to force and heat so that the substrate and the semiconductor chips are bonded together by the thermoset layer disposed thereon.

However, the provision of heating plunger units has implications for the design complexity and cost of such thermocompression apparatuses.

WO 00/41219 A1 discloses an apparatus for connecting components arranged on a substrate to the substrate, the apparatus having a placement station for placing a plurality of electronic components on the substrate and a post-pressing station separated therefrom for connecting the components to the substrate. The post-pressing station comprises an upper tool having a plurality of plungers which are mounted displaceably in the direction of a support surface for the substrate and which are provided as thermode assemblies. The plungers are set up to exert a pressing force on one component at a time. In order to compensate for different heights of the components to be treated on the substrate, the apparatus further comprises a fluid chamber for hydrostatically distributing an application force to the individual plungers. The fluid chamber extends along the backs of the rams and is sealed from the rams by a flexible membrane. For safety reasons, the tappets are pressed against the diaphragm under the pretension of springs so that the tappets are pretensioned in the direction of an initial position.

U.S. Pat. No. 6,015,081 A discloses a thermocompression apparatus for the electrically conductive connection of electronic components arranged on top of each other. In order to ensure a uniform contact pressure between the components, the apparatus comprises a leaf spring which exerts a contact pressure on the components arranged on a contact surface by means of a contact pressure means. The leaf spring is in contact with the pressing means at its respective end sections.

WO 2016/192926 A1 relates to a thermocompression apparatus for connecting electrical components to a substrate, comprising an upper tool and a lower tool with a first heat source and a support surface for placing the substrate with at least one electrical component arranged thereon. The upper tool comprises a pressing element with at least one spring element. The spring element is arranged to be elastically deformed during a relative movement between the upper tool and the lower tool and thereby to exert a force on a substrate located between the pressing element and the support surface with at least one electrical component arranged thereon, in order to press the electrical component against the substrate to be arranged on the support surface for the duration of a curing process. Furthermore, the first heat source is set up to supply heat to the substrate with the electrical component to be arranged between the support surface and the contact pressing element in order to cure a connecting means applied between the substrate and the at least one electrical component.

This results in the task of providing an apparatus and a method that ensure the effort- and cost-reduced bonding of electrical components to a substrate with a high throughput (number of pieces per time unit). The apparatus to be provided and the method are to enable the bonding of an electronic component (e.g. chip) and a substrate (e.g. printed circuit board or RFID antenna material or the like) by means of a high-temperature thermode assembly.

SUMMARY

To solve this problem, a thermocompression apparatus, a method for connecting electrical components to a substrate, and a processing station with two or more thermocompression apparatuses for connecting electrical components to a substrate carrying a plurality of electrical components arranged thereon in one or more rows are proposed in accordance with the independent claims.

A first aspect relates to a thermocompression apparatus for connecting electrical components to a substrate, comprising a lower tool having a support surface for supporting the substrate with at least one electrical component disposed thereon, and an upper tool having a pressing element facing the support surface of the lower tool. The lower tool and/or the upper tool are movable relative to each other in an open/close movement. The lower tool and/or the upper tool are arranged to perform the open/close movement by a first drive and a second drive. The first drive is set up to execute a first movement in a first speed range and a first stroke range. The second drive is arranged to perform a second movement in a second speed range and a second stroke range. The first speed range is less than the second speed range, and the first stroke range is greater than the second stroke range. The lower tool or the upper tool carries a thermode assembly associated with the support surface and/or the pressing element. This thermode assembly is set up to feed heating energy into the component and/or the substrate in order to thermally cure an adhesive introduced between or located on the component and the substrate.

The electrical components can be provided in the form of semiconductor chips, RFID chips, Hi-Q LEDs, etc. The electrical components can also be flat and have electrical contacts on one side, which is to be placed on the substrate. Furthermore, the electrical components can be flat and have electrical contacts on one side, which is to be arranged on the substrate. The electrical contacts can be provided, for example, as contact points, in particular in the form of "bumps", and can be arranged to be electrically conductively connected to contacts or conductor pads arranged on the substrate. The contacts located on the substrate can be formed as a metal layer.

Furthermore, the substrate may comprise one or more materials selected from the group consisting of paper, polyvinyl chloride (PVC), polyethylene (PE), polyethylene terephthalate (PET) or glycol-modified polyethylene terephthalate (PETG), polyethylene naphthalate (PEN), acrylonitrile-butadiene-styrene-copolymerisate (ABS), polyvinyl butyral (PVB), polymethyl methacrylate (PMMA), polyimide (PI), poly vinyl alcohol (PVA), polystyrene (PS), polyvinyl phenol (PVP), polypropylene (PP), polycarbonate (PC) or derivatives thereof.

For connecting the electrical components to the substrate, it is further provided that a connecting agent is applied between the electrical components and the substrate. The bonding agent is preferably provided as a thermally curable adhesive, in particular as a liquid adhesive. Furthermore, the adhesive may be electrically conductive and adapted to mechanically and electrically conductively connect the electrical components and the substrate.

In particular, an anisotropically conductive, thermosetting adhesive based on a modified epoxy resin may be used as the adhesive, which is single-component, thermosetting, solvent-free and/or filled. The adhesive is to be cured, for example, at a temperature of about +100° C. to about +250° C. by means of the thermode apparatus, higher temperatures shortening the curing and lower temperatures prolonging the curing. A variant of the adhesive is DELO MONOPOX AC6545. Rapid curing is essential for high production speeds. When using a 230° C. hot thermode, DELO MONOPOX AC6545 allows curing within one second. With the higher temperature ranges specified above, even shorter curing times are achievable.

In a further variant, a release layer can be arranged over the substrate with the electrical components arranged on it. This can prevent the upper tool from coming into contact with the connecting means during the curing process.

In the apparatus proposed here, the upper tool and the lower tool are movable towards and away from each other. In a variant of the apparatus, the upper tool and the lower tool can be movable together in a longitudinal direction of the apparatus (in the conveying direction of the substrate) in addition to the movements of the first and second drives. This can simplify the placement and removal of the components to be processed on and from the support surface. In addition, the time period during which the upper tool and the lower tool are closed and the thermode cures the adhesive can be longer.

Furthermore, the apparatus may comprise another drive unit to move the upper tool and/or the lower tool relative to each other in a horizontal direction.

In a further variant of the apparatus, the upper tool and the lower tool (or at least their respective components coming into contact with the substrate or the component) are configured to be movable in the direction of conveyance of the substrate with the latter by means of corresponding drives. In this way, the substrate can be configured as a quasi-endless belt onto which portioned adhesive and components are applied in the preceding work stations/steps of the proposed apparatus.

In a variant, the heat source is on the upper tool. In another variant, the lower tool is also equipped with a heat source to preheat the adhesive.

Adhesive curing takes place with the heat source of the upper tool.

In a variant of the apparatus, the upper tool may comprise a second heat source adapted to further apply heat to the substrate with the at least one electrical component to be disposed between the support surface and the pressing element to cure the bonding agent disposed between the substrate and the at least one electrical component.

As a heat source, the thermode is configured to supply heat to the component/adhesive/substrate by means of heat conduction, i.e. by contact. For this purpose, the thermode can be configured in the form of a heating resistor, e.g. as a heating wire, etc. The heating wire heats a contact surface of the pressing element, which then transfers the heat to the substrate/chip.

In a variant of the apparatus, the first drive is set up to move the lower tool or the upper tool in the first movement between a first position and a second position. In a variant of the apparatus, the second drive is set up to move the lower tool or the upper tool in the second movement between the second position and a third position. In a variant of the apparatus, the first position is preferably a park position, the second position is an open position, and the third position is a closed position. In a variant of the apparatus, the first drive and the second drive are set up and controlled to execute the first movement and the second movement either consecutively or overlapping in time.

The distribution of the total stroke path between the lower tool or the upper tool from the park position via the second position into the closed position to the first and second drives with different partial stroke paths and different speeds allows for a particularly high overall dynamic and a resulting high throughput.

In a variant of the apparatus, the first drive and the second drive are set up to act in the same direction or in opposite directions in order to effect the open/close movement of the lower tool and the upper tool relative to each other. In a variant of the apparatus, the two drives can be assigned to the same side of the substrate, i.e. only to either the upper or the lower tool. Alternatively, in a variant of the apparatus, the two drives can be assigned to different sides of the substrate, i.e. to the upper and lower tool.

The first drive and the second drive are thus either both assigned to the lower tool or the upper tool, or one of the two drives is assigned to the lower tool and the other of the two drives to the upper tool.

In a variant of the apparatus, the thermode assembly is set up and controlled to inject heating energy into the component and/or the substrate in a temperature range from about 300° C. to about 500° C. during a heating interval of about 0.07 to about 1.5 seconds, or about 0.1 to less than about 1 second, in order to thermally cure the adhesive introduced between the component and the substrate. In a variant of the apparatus, the thermode assembly has a heating energy application surface of approximately circular shape and a diameter of less than about 5 mm. In a variant of the apparatus, the thermode assembly comprises a thermal insulating body which almost completely surrounds a heating element which is to be fed with electrical current. In a variant of the apparatus, at least the contact surface is exposed.

In the thermocompression apparatus, in a variant of the apparatus, a force sensor is assigned to the lower tool and/or the upper tool, which is set up to detect a contact force between the lower tool and the upper tool on the substrate located between them, the component arranged on the substrate, and the adhesive introduced between the component and the substrate at least in selected closed positions of the lower tool and the upper tool following one another at and to signal this to a controller.

In a variant of the thermocompression apparatus, the first drive is configured as a pneumatic or hydraulic cylinder and the second drive is configured as a plunger coil actuator.

In a variant of the thermocompression apparatus, the first drive and/or the second drive are controlled by the control system in control loop mode during the first movement or the second movement. In a variant of the apparatus, a force measurement with the above-mentioned force sensor and/or a displacement measurement is used to determine a desired value, in particular a force or a displacement position of the first drive and/or the second drive.

In a variant, the pneumatic or hydraulic cylinder is provided with a piston rod, via which a fitting with the second drive, the thermode assembly and possibly the force sensor are to be moved. These cylinders are either single-acting or double-acting. A cylinder can be configured with a single or continuous piston rod, adjustable end position damping and a sensor for contactless position detection.

In the plunger coil actuator, the force of a current-carrying conductor in a (permanent) magnetic field is proportional to the magnetic field strength and the current flowing through the conductor. When the direction of the current changes, the direction of the force also changes. Thus, the plunger coil actuator works bidirectionally with the same behavior in both working directions. The small moving mass of the plunger coil allows highly dynamic operation with high acceleration and small hysteresis. Thus, the second movement of the lower tool relative to the upper tool is well controllable and reproducible in both directions, even when the direction is reversed. The plunger coil actuator is very controllable in its movement and shows a low overshoot; the force to be exerted by it on the component can also be controlled very sensitively.

During operation, the plunger coil actuator generates a counter-voltage (back-EMF) which is proportional to the relative speed between the coil and the permanent magnet, so that the actuator would reach a constant speed in steady state if the load and the supply voltage were constant. The coil resistance is temperature dependent. Therefore, constant force ratios are achievable with, for example, a servo controller implemented in the control system in current control mode. In different variants of the apparatus, the plunger coil actuator can be operated both by means of current control and by means of speed control.

The plunger coil actuator acts linearly and the moving plunger coil is guided in a roller bearing, alternatively in a plain bearing, in a variant of the apparatus. In a further variant of the plunger coil actuator, a position sensor is integrated. The plunger coil actuator can also be configured without integral bearing of the moving plunger coil. The moving plunger coil generates an even force in both directions of movement if it is controlled bipolarly, as in a variant of the plunger coil actuator. In this variant, the plunger coil actuator has a particularly low hysteresis, which is very advantageous in the present application in order to avoid damaging the surface of the component when the lower tool is moved relative to the upper tool.

Another aspect relates to a method of operating a thermocompression apparatus for connecting electrical components to a substrate. The apparatus to be used in this regard is, for example, one of the type described above. The method comprises the steps of:

Placing the substrate with at least one electrical component arranged thereon on a contact surface of the lower tool under a pressing element of an upper tool.

Moving the lower tool and the upper tool relative to each other in an open/close movement by a first drive and a second drive.

In a variant of the method, the first drive executes a first movement in a first speed range and a first stroke range.

In a variant of the method, the second drive executes a second movement in a second speed range and a second stroke range.

Thereby, in a variant of the method, the first speed range is smaller than the second speed range, and the first stroke range is larger than the second stroke range.

In a variant of the method, the lower tool or the upper tool carries a thermode assembly associated with the contact surface or the contact pressing element.

In a variant of the method, this thermode assembly is set up to feed heating energy into the component and/or the substrate during at least part of the open/close movement in order to thermally cure an adhesive introduced between the component and the substrate.

In a variant of the method, the first drive, the lower tool or the upper tool are moved relative to each other in the first movement between a first position and a second position. In a variant of the method, the second drive, the lower tool or the upper tool are moved relative to each other in the second movement between the second position and a third position. Preferably, the first position is a park position, the second position is an open position, and the third position is a closed position. The first drive and the second drive guide. In a variant of the method, the first movement and the second movement are performed either consecutively or overlapping in time. In a variant of the method, the substrate with the component and the adhesive are conveyed continuously and/or intermittently (clocked) between the support surface and the pressing element of the lower tool or of the upper tool in the open position of the lower tool and of the upper tool.

In a variant of the method, in a 1st phase, after the first drive has performed the first movement to the extent that the lower tool and the upper tool have moved from the park position to the open position, the second drive begins to perform the second movement so that the lower tool and the upper tool move relative to each other from the open position to the closed position.

In a variant of the method, the second drive accelerates in an acceleration section of the 1st phase to execute the second movement until a predetermined first set speed, e.g. 100 mm/s to 300 mm/s, e.g. 200 mm/s, is reached at which the lower tool and the upper tool move relative to each other from the open position to the closed position.

In a variant of the method, in a deceleration section of the 1st phase, the second drive for executing the second movement decelerates until a predetermined second set speed, lower than the first set speed, e.g. 2 mm/s to 20 mm/s, e.g. 5 mm/s, is reached, at which the lower tool and the upper tool move relative to each other from the open position to the closed position, in order to detect the component and/or a position of the component on the substrate at this second set speed.

In a variant of the method, in a 2nd phase, while the lower tool and the upper tool move relative to each other from the open position into the closed position in order to determine the component and/or its position on the substrate by touching the component, a control signal of the second drive, e.g. a control voltage of the plunger coil actuator, is limited to a predetermined maximum value. This ensures that the component is not damaged when the pressing element of the upper tool hits the component.

In a variant of the method, in the 2nd phase, while the lower tool and the upper tool move relative to each other from the open position to the closed position in order to detect the component and/or its position on the substrate, continuously or intermittently an instantaneous velocity $\Delta s/\Delta t$ of the lower tool relative to the upper tool for falling below a threshold value, e.g. 3 µm/1 ms, is monitored. In a variant of the method, the threshold value of this instantaneous speed is about 1 to 4 orders of magnitude (powers of ten) below the second set speed. In a variant of the method, this falling below the threshold value is evaluated as a contact of the component on the substrate by the upper tool.

In a variant of the method, in a 3rd phase, while the lower tool and the upper tool have reached the closed position relative to each other and contact has been made with the component, the control signal of the second drive, e.g. a control voltage of the plunger coil actuator, is limited to a predetermined pressing value during a predetermined pressing time. This pressing value is representative of the force with which the component is pressed onto the substrate by the adhesive.

In a variant of the method, in the 6th phase, while the lower tool and the upper tool have reached the closed position relative to each other and contact has been made with the component, the drive signal of the second drive, e.g. a drive voltage of the plunger coil actuator, runs through a predetermined press value force/time profile during the predetermined press time in order to change the force with which the component is forced onto the substrate by the adhesive.

In a variant of the process, in a 7th phase, after the predetermined pressing time has elapsed, the lower tool and the upper tool move relatively away from each other from the closed position to the open position.

In a variant of the method, a comparison of the location of the contact of the component by the upper tool and/or the determination of the position of the component on the substrate with a predetermined path or position value is carried out in the 2nd to 3rd phases after the start of the movement from the open position to the closed position of the upper tool relative to the lower tool. An error situation is detected if the predetermined path or position value deviates (in particular falls below) by more than a predetermined first deviation value. One reason for this may be that two components have been placed on top of each other at the same position on the substrate. Another reason may be that the height of a component deviates from an expected value for other reasons, such as an epitaxial error. In the error situation, an error message or an interruption request is signaled to a machine control. Alternatively or additionally, an error situation can be detected if the predetermined path or position value deviates (in particular falls below) by less than a second predetermined deviation value. Alternatively or additionally, an error situation can be detected in the event of a deviation (in particular, exceeding) of the predetermined path or position value by a predetermined deviation value, because no component has been placed on the substrate. In such an error situation, a machine control is also signaled with a request for interruption.

In a variant of the method, a force sensor detects a contact force between the lower tool and the upper tool on the substrate located between them, the component placed on the substrate, and the adhesive placed between the component and the substrate, at least in selected successive closed positions of the lower tool and the upper tool, and signals this to a controller. In a variant of the method, a contact force is detected after the substrate or a section of the substrate with the component arranged thereon and the adhesive introduced between them is introduced between the lower tool and the upper tool before the movement of the lower tool and the upper tool relative to each other from the open position to the closed position is completed.

In a variant of the method, an indexing register for the substrate is assigned to the controller, in which placement positions of the substrate are to be entered, on which a component is arranged, or on which no component is arranged. In a variant, this indexing register is a structured file, for example in table form, which can be read out position by position by the controller. These placement positions of the substrate are entered into this indexing register beforehand. The controller then reads out the placement positions of the substrate from the indexing register, on which a component is arranged, and controls the respective first and second drives and the thermode, etc. in time so that the bonding of the component to the substrate is carried out at these placement positions by curing the adhesive.

In a variant of the method, the control reads out from the indexing register the placement positions of the substrate on which no component is located. At these placement positions, the connection of the non-existent component to the substrate is not carried out.

In a variant of the method, the controller enters in the indexing register for each of the placement positions,
whether the placement position is without a component,
whether there is adhesive at the placement position,
whether component and adhesive are present at the placement position, and/or
if at least the component is present at the placement position, position of the component as X, Y coordinates and its angle of rotation.

In a variant of the method, if the placement position is without a component, the controller determines and causes the steps for connecting the component to the substrate not to be performed.

In a variant of the method, if adhesive is present at the placement position, the controller determines and causes the lower tool and the upper tool to be moved relative to each other to an intermediate position to cure the adhesive without contact.

In a variant of the method, if component and adhesive are present at the placement position, the controller determines and causes the bonding of the component to the substrate to be performed by curing the adhesive.

In a variant of the method, data to be entered into the indexing register for each of the placement positions, image captures or metadata determined from image captures for adhesive curing, the component position X, Y and the component rotation are signaled to the control from a machine module upstream of the apparatus and/or an image capturing inspection system upstream of the apparatus, and processed further in the control.

In a variant of the process, image captures or metadata determined from image captures for adhesive curing, the component position X, Y and the component rotation are signaled to the control system from an image capturing inspection system downstream of the apparatus so that they can be processed further by the control system and/or forwarded by the latter to a downstream or higher-level process station.

Another aspect relates to a processing station comprising two or more thermocompression apparatuses, in particular of the type described above, for connecting electrical components to a substrate carrying a plurality of electrical components arranged in one or more rows thereon, wherein either two thermocompression apparatuses are arranged and oriented to connect electrical components arranged in a row in a direction of conveyance of the substrate to the substrate, or two or more thermocompression apparatuses are arranged and oriented to connect electrical components arranged in two or more rows in a direction of conveyance of the substrate to the substrate. direction of the substrate to the substrate, or two or more thermocompression apparatuses are arranged and oriented to connect electrical components arranged in two or more rows in a direction of conveyance of the substrate to the substrate, wherein the two or more thermocompression apparatuses are either arranged adjacent to one another in a line transverse to the direction of conveyance or are arranged at a distance from one another in two lines transverse to the direction of conveyance, wherein the distance between two thermocompression apparatuses is fixed or can be varied such that substantially about one row of electrical components is free, and wherein the thermocompression apparatuses of the two lines are to be offset transverse to the direction of conveyance by about one row of electrical components.

The described apparatus/process/processing station is less complex; compared to known apparatuses, it makes do with significantly fewer components, is simpler to execute and allows more processed components per unit of time. Accordingly, the present apparatus can be manufactured and operated at a much lower cost. This lower complexity further enables the described apparatus/processing station to be easily adapted to different components to be processed. As a result, the processing of different components as well as the production of different construction groups can be easily realized. The new thermocompression apparatus replaces a large number of old thermocompression apparatuses due to its significantly reduced process times.

BRIEF DESCRIPTION OF THE DRAWINGS

Further objectives, features, advantages and application possibilities result from the following description of non-restrictive variant examples and the associated drawings.

DETAILED DESCRIPTION OF THE EMBODIMENTS

Figure 1:
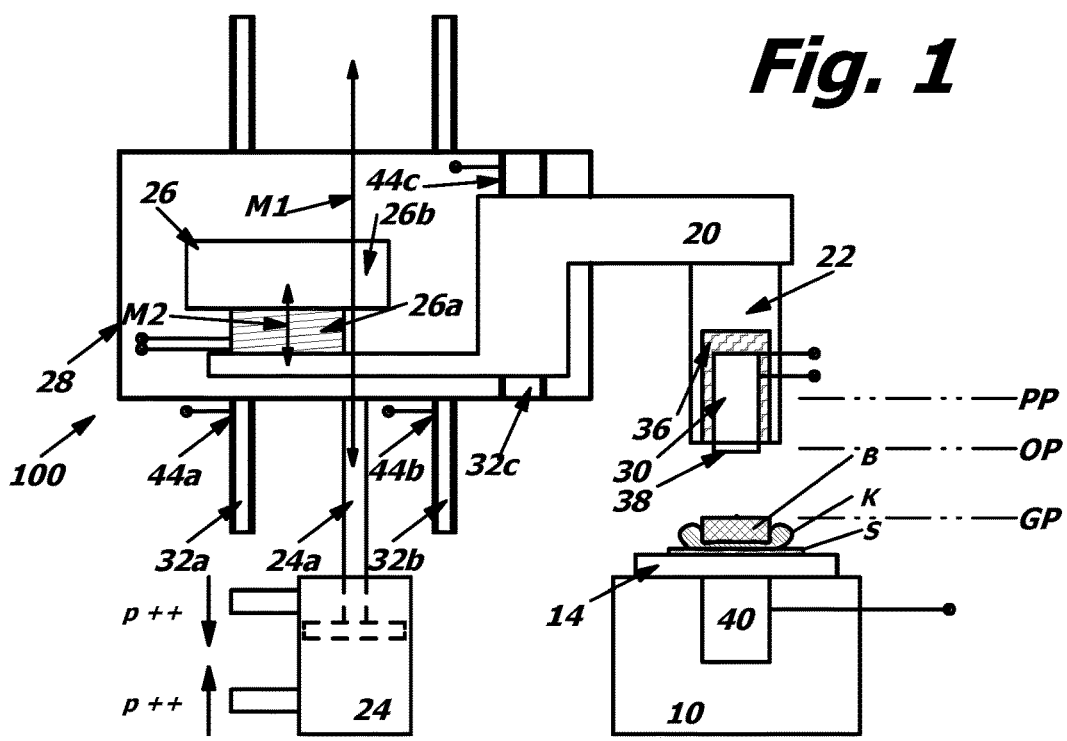
FIG. 1 shows a schematic front view of a thermocompression apparatus for connecting electrical components to a substrate.

FIG. 1 shows the schematic structure of a variant of a thermocompression apparatus 100 for bonding electrical components B to a substrate S. This thermocompression apparatus 100 operates with a lower tool 10 with a flat support surface 14 for supporting the substrate S with at least one electrical component B arranged thereon, and an upper tool 20 with a contact pressing element 22 facing the support surface 14 of the lower tool 10. A thermode assembly 30 serves to firmly bond the component B to the substrate S by thermally curing the adhesive K introduced between them.

Electrically conductive contact surfaces and possibly conductor tracks are provided on the substrate S. In a previous processing step, a bonding agent in the form of an adhesive K was applied to the substrate S. The adhesive K is liquid and cures thermally. In a further preceding processing step, an electrical component B, in this case a semiconductor chip with a flip-chip design, was applied to the substrate S and the liquid adhesive K. On the lower side, the electrical component B has electrically conductive contacts which are in contact with the electrically conductive contact surfaces of the substrate S. The contacts can be in the form of metal contacts, for example. The contacts can, for example, be in the form of metallic contact feet or so-called "bumps".

In the variant illustrated here, the lower tool 10 with its flat support surface 14 for placing the substrate S is arranged in a fixed position and the upper tool 20 with its contact pressing element 22 is movable for this purpose. A first drive 24 and a second drive 26 are provided to move the lower tool 10 and the upper tool 20 relative to each other in an open/close movement.

In the variant illustrated here, the first drive 24 is configured as a pneumatic cylinder and the second drive 26 is configured as a plunger coil actuator. The first drive 24 has a pneumatic cylinder with a piston rod 24a, which moves an armature 28 up and down, which carries the second drive 26 with the thermode assembly 30. For this purpose, the armature 28 is guided for longitudinal displacement in two linear guides 32a, 32b. The cylinder of the first drive 24 is double-acting. For this purpose, the upper port of the cylinder in FIG. 1 is to be pressurized with overpressure p++ in order to move the piston rod 24a downwards along the movement arrow M1, and the lower port of the cylinder is to be pressurized with overpressure p++ in order to move the piston rod 24a upwards along the movement arrow M1.

The second drive 26 carried by the armature 28 is configured as a plunger coil actuator, whereby a plunger coil 26a, which is circular cylindrical for example, is received in an annular gap of the opposite design of a permanent magnet 26b, which is arranged stationary on the armature 28, so that it can move longitudinally along the movement arrow M2. A current flowing through the plunger coil 26a determines the deflection of the plunger coil 26a by its current strength and polarity.

The free end of the plunger coil 26a, which is at the bottom in FIG. 1, is coupled to an offset supporting arm 28a. The support arm 28a is longitudinally displaceably guided on a linear guide 32c in accordance with the deflection of the plunger coil 26a. With its free end, which is on the right in FIG. 1 and projects laterally beyond the armature 28, the support arm 28a forms the upper tool 20 with the thermode assembly 30, which faces the lower tool 10.

Depending on the stiffness of the drives, for example, the linear guides 32a, 32b, 32c can be dispensed with if necessary.

The thermode assembly 30 has a contact surface 38 adapted to the dimensions of the component B for transferring the heating energy. The thermode assembly 30 is to be supplied with current by the controller 50 in such a way that heating energy is to be fed into the component B and/or the substrate S in a temperature range of about 300° C. to about 500° C. during a heating interval of about 0.1 to less than about 1 second. The temperature and the duration of the heating interval are selected so that the adhesive K introduced between the component B and the substrate S is thermally cured.

In this variant, the thermode assembly 30 has a circular contact surface 38 for the heating energy with a diameter of less than about 5 mm to be adapted to the dimensions of the component B. The thermode assembly 30 has an approximately circular heating element 34 which is surrounded by a thermal insulating body 36. The contact surface 38 oriented towards the lower tool 10 is exposed.

The respective amplitude of the first and second drives 24, 26 is specified by a control 50 in the manner described in detail below. The first and second drives 24, 26 can be actuated simultaneously or consecutively in both directions independently of each other. Thus, in the variant shown, the first drive 24 serves to move the upper tool 20 in the first movement M1 between a first position-park position PP—and a second position—open position OP. In the variant shown, the second drive 26 is used to move the upper tool 20 in the second movement M2 between the second position—open position OP—and a third position—closed position GP.

A force sensor 40 is associated with the lower tool 10. This force sensor 40 serves to detect a contact force between the lower tool 10 and the upper tool 20 on the substrate S located between them, the component B located on the substrate S, and the adhesive K inserted between the component B and the substrate S when the lower tool 10 and the upper tool 20 move to or are in the closed position. A value reflecting this contact force or a corresponding data telegram is then signaled to the controller 50. For this purpose, the force sensor 40 is integrated in the lower tool 10 and detects the force acting on it through the support surface 14, which is exerted by the lower tool 10 moved into the closed position.

In a variant of the apparatus 100, displacement sensors 44a, 44b, 44c are associated with one or more of the linear guides 32a, 32b, 32c in order to detect, instead of or in addition to the force sensor 40, the effects of the movement between the lower tool 10 and the upper tool 20 on the substrate S located between them, the component B arranged on the substrate S, and the adhesive K placed between the component B and the substrate S. A value or corresponding data telegrams along the movements M1, M2 representing the respective travels of the first and/or second drive 24, 26 are then also signaled to the controller 50. For this purpose, the displacement sensors 44a, 44b, 44c are integrated into the respective linear guides 32a, 32b, 32c and detect the respective travels of the first and/or second drive 24, 26.

Based on these signals, the first drive 24 and the second drive 26 are controlled by the controller 50 in control loop mode during the first movement M1 or the second movement M2. In this case, the force and/or displacement measurements serve as actual values for determining a desired quantity, in particular a displacement position of the first drive 24 and/or of the second drive 26, or a force resulting from the movements of the first drive 24 and/or of the second drive 26 on the substrate S located between them, the component B arranged on the substrate S, and the adhesive K introduced between the component B and the substrate S.

The control loop operation based on the force and/or displacement measurements is used to execute the first movement M1 with the first drive 24 in a first speed range and a first stroke range, and to execute the second movement M2 with the second drive 26 in a second speed range and a second stroke range. In this case, the first speed range is smaller than the second speed range, and the first stroke range is larger than the second stroke range. Already before and/or during the approach of the upper tool 20 to the lower tool 10, the control unit 50 energizes the thermode assembly 30 so that it has a temperature necessary for curing the adhesive. As soon as the contact surface 38 approaches the component B, heating energy is fed into the component B and the substrate S in order to thermally cure the adhesive K located between the component B and the substrate S.

A method of operating a thermocompression apparatus 100, in particular one having the above features and characteristics performs the following steps:

The substrate S with at least one electrical component B arranged on it is placed on the support surface 14 of the lower tool 10 under the contact pressing element 22 of the upper tool 20. In one process variant, the substrate S is a quasi-endless strip product with components B applied to it in a previous process step in several rows, which are placed on the substrate S with an adhesive K that is still to cure. The adhesive was dispensed in a dosed manner at the point intended for the component B before the component B was dispensed.

The first drive 24 and the second drive 26 move the lower tool 10 and the upper tool 20 relative to each other as an open/close movement. The first drive 24 performs the first movement in the first speed range and the first stroke range. The second drive 26 executes the second movement in the second speed range and the second stroke range. The first speed range is smaller than the second speed range, and the first stroke range is larger than the second stroke range. This is illustrated in FIG. 2.

During at least part of the open/close movement, the thermode assembly 30 carried by the upper tool 20 and associated with the pressing element 22 feeds heating energy into the component B and/or the substrate S in order to thermally cure the adhesive K introduced between the component B and the substrate S.

Figures 2, 2A:
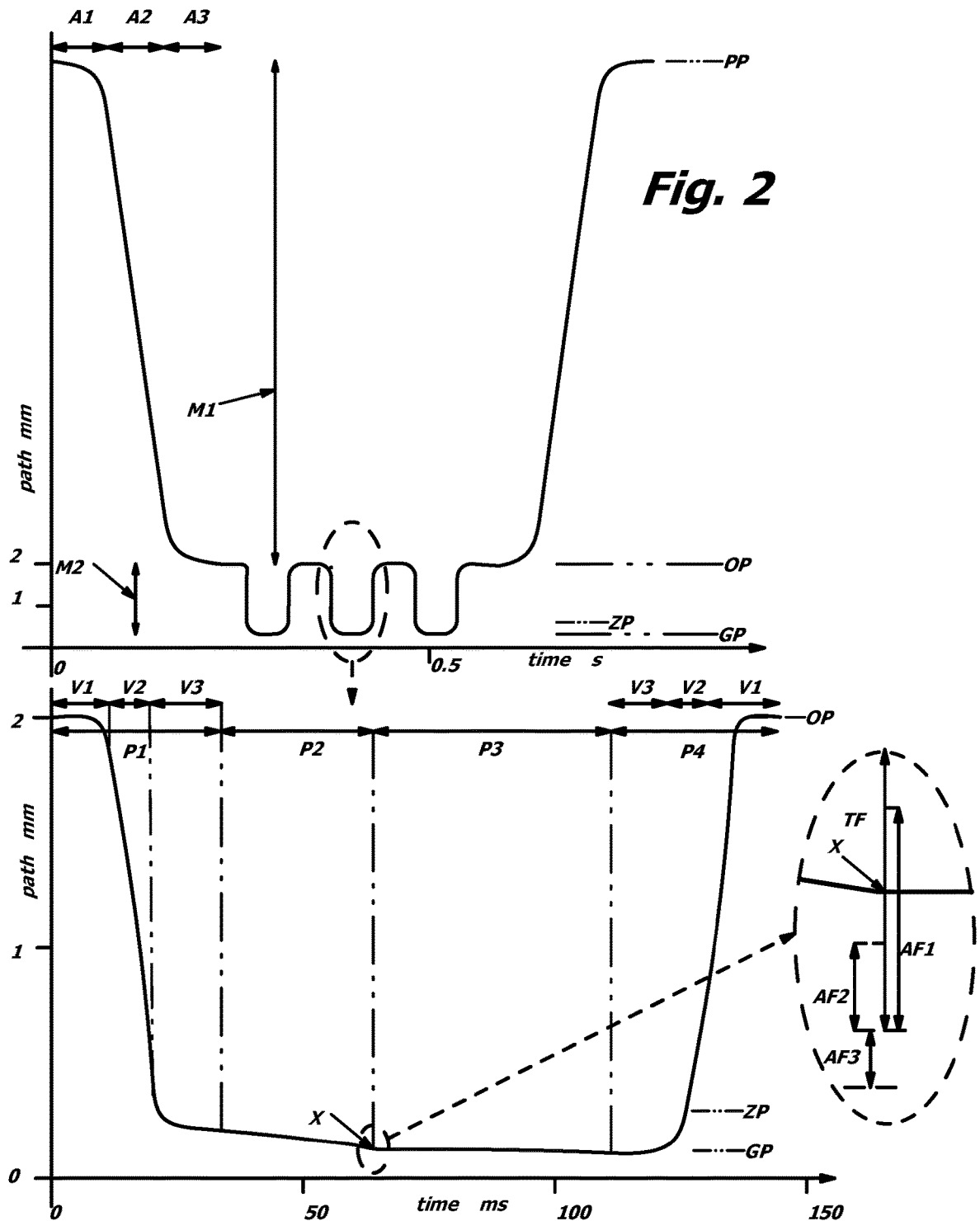
FIGS. 2, 2a show schematic movement diagrams of the drives of the thermocompression apparatus from FIG. 1.

FIG. 2 further illustrates how the first drive 24 moves the upper tool 20 in the first movement M1 relative to the stationary lower tool 10 between the first position PP and the second position OP. The second drive 26 then moves the upper tool 20 in the second-oscillating-movement M2 between the second position OP and the third position GP relative to the lower tool 10. The first position is the park position PP, the second position is the open position OP, and the third position is the closed position GP. In the variant shown here, the first drive 24 and the second drive 26 perform the first movement M1 and the second movement M2 in succession. In FIG. 2, the oscillating repeated second movement M2 of the upper tool 20 between the two position OP and the third position GP relative to the lower tool 10 is shown. This movement serves to continuously or intermittently convey the components located on the substrate S, which is in the form of strip material, more precisely the adhesive K located between the components B and the substrate S, between the support surface 14 and the pressing element 22 of the lower tool 10 or of the upper tool 20 in their open position OP, and to apply heating energy to them in their closed position GP.

FIG. 2a illustrates the sequence of closing-heating-opening from FIG. 2 in detail.

First, the first drive 24 executes the first movement M1 until the upper tool 20, coming from the park position PP, has assumed the open position OP (height 2 mm in FIG. 2a) together with the lower tool 10. The first movement M1 has an acceleration section A1, a high-speed section A2 and a deceleration section A3 (see FIG. 2).

In a first phase P1, the second drive 26 begins to execute the second movement M2 so that the upper tool 20 moves from the open position OP towards the lower tool 10 in order to assume the closed position GP. The second movement M2 has an acceleration section V1, a high-speed section V2, and a deceleration section V3 (see FIG. 2a).

In the acceleration section V1, the second drive 26 accelerates to execute the second movement M2 until a predetermined first target speed, in this case close to 200 mm/s, is reached at which the lower tool 10 and the upper tool 20 move relative to each other from the open OP to the closed position GP (see FIG. 2a).

In the deceleration section V3 of the 1st phase, the second drive 26 for executing the second movement M2 decelerates this until a predetermined second set speed, lower than the first set speed, in this case about 5 mm/s, is reached, at which the upper tool 20 moves from the open position OP into the closed position GP towards the lower tool 10. The upper tool 20 then continues to move at this lower second set speed in order to detect the component B and/or a position of the component B on the substrate S with this.

While the upper tool 20 moves towards the lower tool 10 from the open position OP to the closed position GP by means of the second drive 26 in order to execute the second movement M2 at the second, lower setpoint speed, a control signal of the second drive 26, in this case the control voltage of the plunger coil actuator, is limited to a predetermined maximum value in a second phase P2 in order to determine the component B and/or its position on the substrate S by touching it. This slow movement, combined with the reduced force of the plunger coil actuator, prevents damage to the component B when the contact pressing element 22 of the upper tool 20 hits it.

While the upper tool 20 moves towards the lower tool 10 from the open position OP to the closed position GP by the second drive 26 for executing the second movement M2 at the second, lower nominal speed, in order to detect the component B and/or its position on the substrate S, an instantaneous speed of the upper tool 20 relative to the lower tool 10 is continuously monitored.

$$\frac{\Delta s}{\Delta t}$$

of the upper tool 20 relative to the lower tool 10 is continuously monitored for falling below a threshold value, e.g.

$$\frac{3\,\mu m}{1\,ms},$$

is monitored. This threshold value is significantly (for example, between 1 and 4 orders of magnitude below the second target velocity). As soon as the instantaneous speed $$\frac{\Delta s}{\Delta t}$$

of the movement M2 of the upper tool 20 falls below this threshold value, it is determined in the control system that the component B on the substrate S has been touched by the upper tool 10. This is marked as X "Contact" in FIG. 2*a*.

While the lower tool 10 and the upper tool 20 maintain the closed position GP and contact is made with the component B—under the heating effect of the thermode assembly 30 on the component B and the adhesive K underneath—the control signal of the second drive 26, in this case the control voltage of the plunger coil actuator, is limited. In this 3rd phase P3, a predetermined pressing time, the control signal of the second drive 26 is limited to a predetermined pressing value which is representative of the force with which the component B is pressed onto the substrate S by the adhesive K. During this time, the component B is hardened by the adhesive K underneath. During this time, the adhesive K cures due to the heating effect and the force acting on the component B.

In this 3rd phase P3, in the process variant illustrated in FIG. 2*a*, the force with which the component B is forced onto the substrate S by the adhesive K is constant. In a process variant not further illustrated here, the force with which the component B is forced onto the substrate S by the adhesive K runs through a predetermined press value/force/time profile during the predetermined press time from the contact of the component B by the upper tool until it is lifted off the component B, according to which the component B is forced into the adhesive K onto the substrate S.

In a 4th phase P4, after the predetermined pressing time in the 3rd phase P3 has elapsed, the lower tool 10 and the upper tool 20 are moved relatively away from each other from the closed position GP to the open position OP by the second drive 26 to execute the second movement M2.

In the 2nd and 3rd phases P2, P3, a comparison of the location X of the contact of the component B by the upper tool 20 (more precisely, of the pressing element 22) and/or of the determination of the position (or the height of the upper side) of the component B on the substrate S with a predetermined travel or position value TF after the start of the movement from the open position OP to the closed position GP is carried out by the control. The travel or position value TF thus defines a height or travel range in which the contact of the pressing element 22 with the upper side of the component B should occur. If the predetermined displacement or position value TF is undershot by more than a predetermined first deviation value AF1, an error situation is detected, for example because two components B have been placed on top of each other at the same position on the substrate S, or the height of a component B deviates from an expected value for other reasons, such as an epitaxial defect of the component B. An error message or an interruption request is then signaled to a (superior) machine control.

In addition, if the predetermined path or position value TF is undershot by more than a second predetermined deviation value AF2, an error situation is detected, or if the predetermined path or position value TF is exceeded by a predetermined third deviation value AF3, an error situation is detected because no component B has been placed on the substrate S. Thereupon, an error message or an interruption request is signaled to a (higher-level) machine control. This is to prevent the thermode assembly 30 or the contact surface 22 from touching the adhesive K or the substrate S, as this could lead to contamination of the contact surface 22 of the thermode assembly 30 or to burn holes in the substrate S. If the controller 50 detects that contact with the adhesive K or the substrate S is imminent because of the missing component B, the upper tool 20 stops the thermode assembly 30 and moves it to a retracted safety position ZP that is close to the expected X "contact" position and remains there for a longer period of time. This serves to cure any adhesive K that may be present without contact.

After this period has elapsed, in the 4th phase P4 the upper tool retracts the thermode assembly 30 to the open position OP in the inverse manner as in the first phase P1. From there, a new cycle start begins with the first phase P1. The substrate S can be transported further during this in order to position a subsequent component between the upper and lower tool.

Due to the slow search speed during the 2nd phase, an insufficiently predetermined search position can lead to very long delays until X "contact". The result would be a greatly slowed machine cycle. In addition, the thermode assembly is also subject to a change in length during the heating phase. If the X "touch" position was measured in the cold state and the expected change in length was not taken into account, this can lead to premature contact of the surface of the component by the upper tool. Both aspects are compensated for during operation by the control loop in the control system using the method described above. The aim of the control is to achieve the shortest possible search phase in order to achieve a high throughput.

In one method variant, a force sensor 40 detects a contact force between the lower tool 10 and the upper tool 20 on the substrate S located between them, the component B located thereon, and the adhesive K placed between them when the lower tool 10 and the upper tool 20 move to the closed position and remain therein. The sensed contact force is signaled to the controller 50. Before the movement of the lower tool 10 and the upper tool 20 relative to each other from the open position OP to the closed position GP is completed, and no contact pressure force is yet exerted, a detection of a contact pressure force TARA takes place after the substrate S or a section of the substrate S with the component B arranged thereon and the adhesive K introduced between them is introduced. The substrate S bears on the force sensor 40. Therefore, detection of the bearing force TARA allows compensation of an influence on the measurement result of the force measurement resulting from a fluctuating tension of the substrate S in the conveying direction. This TARA function is activated after the substrate S has been conveyed so that the component B is positioned directly above the force sensor 40, and before the thermode assembly 30 hits it.

In one method variant, an indexing register IR for the substrate S is assigned to the controller 50. Insertion positions of the substrate S on which a component B is arranged or on which no component B is arranged are to be entered into the indexing register IR. This entry is made either by an external data source or by the controller 50 with data supplied from outside.

In a variant of the controller 50 not further illustrated, data to be entered into the indexing register IR for each of the placement positions, image captures or metadata determined from image captures relating to adhesive curing, the component position X, Y and the component rotation are signaled from a machine module upstream of the apparatus 100 and/or an image capturing inspection system IS upstream of the apparatus 100, and further processed in the controller 50 for the operation of the apparatus 100.

In a further variant of the control 50 not further illustrated, image captures or metadata determined from image captures for adhesive curing, the component position X, Y and the component rotation are signaled from an image capturing inspection system downstream of the apparatus 100, so that these are further processed and/or forwarded to a downstream or higher-level process station.

The controller 50 reads out the respective placement positions Pos X, Pos Y of the substrate S on which a component B is placed from the indexing register IR when performing the adhesive curing operations. At these placement positions, the bonding of the component B to the substrate S is then carried out by curing the adhesive K in the manner described above. Moreover, in a variant, the control unit 50 or the external data source also enters into the indexing register IR for each of the placement positions whether the placement position is without component B y/n, whether adhesive K y/n is present at the placement position, and whether component and adhesive are present at the placement position, and/or if at least component B is present at the placement position, the position of component B as X, Y coordinates and its angle of rotation THETA. Insofar as the control unit 50 reads out from the indexing register IR the placement positions of the substrate S on which no component B is arranged, i.e. B y/n=n, the bonding of the component B to the substrate S by curing the adhesive K is not carried out at these placement positions.

Insofar as the control 50 reads from the indexing register IR the placement positions of the substrate S on which no component B is arranged, i.e. B y/n=n, but adhesive is present, i.e. K y/n=y, the bonding of the component B to the substrate S by curing the adhesive K is not carried out at these placement positions, the lower tool 10 and the upper tool 20 are moved relative to each other into an intermediate position ZP. There, with distance between the thermode assembly 30 and the adhesive K, the latter is cured without contact.

Otherwise, if the component B and the adhesive K are present at the placement position, the controller 50 will perform the bonding of the component B to the substrate S by curing the adhesive K.

FIGS. 3*a*-3*d* show different configurations of a processing station, the processing stations being configured with two or more thermocompression apparatuses 100 for connecting electrical components B to the substrate S carrying a plurality of electrical components B arranged thereon in one or more rows.

Figure 3A:
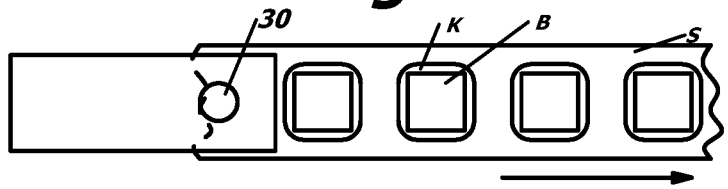
FIGS. 3a-3d show schematic different configurations of a processing station, with one more thermocompression apparatuses for substrate webs with one or more component rows.

FIG. 3*a* illustrates in plan view a processing station having the configuration of FIG. 1, wherein an endless substrate web supports a row of components to be processed by a thermocompression apparatus 100.

Figure 3B:
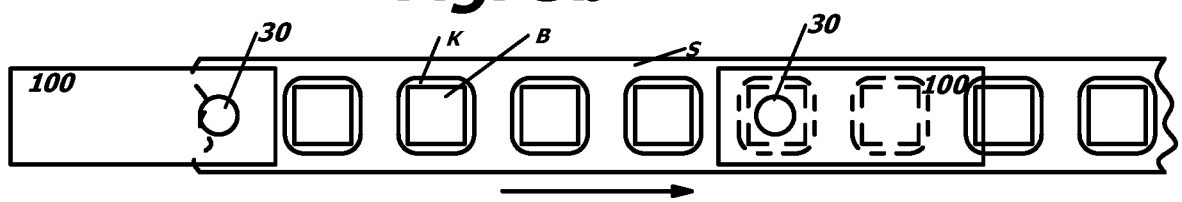

FIG. 3*b* shows a top view of a processing station with two thermocompression apparatuses 100. These two thermocompression apparatuses 100 process an endless substrate web with a row of components. The two thermocompression apparatuses 100 are arranged in mirror image and at a distance from each other along the substrate web.

Figure 3C:
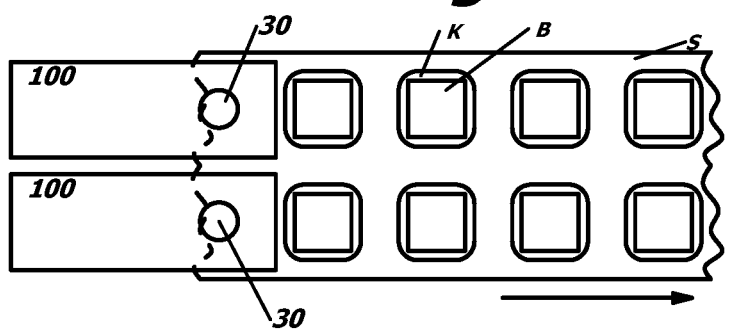

FIG. 3*c* illustrates a top view of a processing station with the configuration of FIG. 3*a* doubled in the width of the substrate web, whereby the substrate web carries two parallel rows of components, each of which is to be processed by one of the two thermocompression apparatuses 100. Here, the two thermocompression apparatuses 100 are arranged adjacent to each other in a line transverse to the direction of conveyance of the substrate web.

Figure 3D:
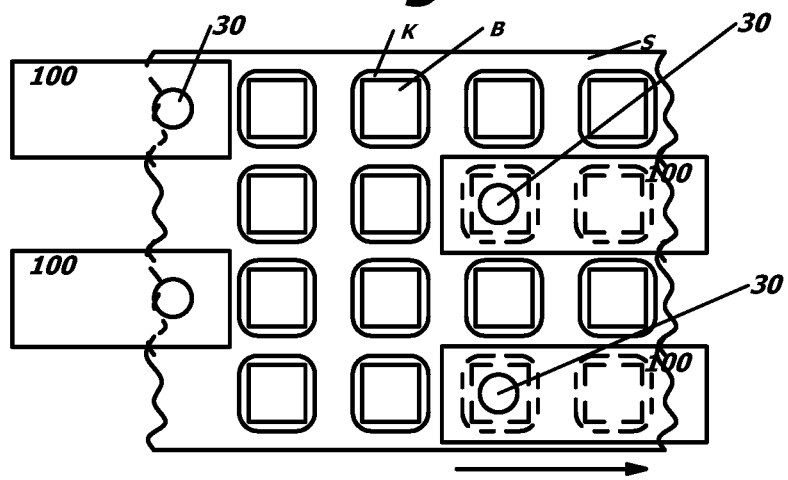

FIG. 3*d* illustrates in plan view a processing station having the configuration of FIG. 3*a* quadrupled in width of the substrate web, the substrate web carrying four parallel rows of components each to be processed by one of the four thermocompression apparatuses 100. The four thermocompression apparatuses 100 are spaced apart in two lines transverse to the direction of conveyance, the spacing of two thermocompression apparatuses 100 being determined such that approximately one row of electrical components B is unobstructed substantially between two adjacent thermocompression apparatuses 100 (e.g. the top row in FIG. 3*d* and the 3rd row). The thermocompression apparatuses 100 of the two lines (in FIG. 3*d* the thermocompression apparatuses 100 of the uppermost and the 3rd row form a line, and the thermocompression apparatuses 100 of the lowermost and the 2nd row form a line transverse to the direction of conveyance) are each staggered by approximately one row of electrical components B. This offset arrangement is used for component row distances that are smaller than twice the width of a thermocompression apparatus.

The variants of the apparatus described above, as well as its construction and operating aspects, are merely intended to provide a better understanding of the structure, operation and features; they do not limit the disclosure to the variants. The Figs. are partly schematic, with essential features and effects sometimes shown significantly enlarged, in order to clarify the functions, operating principles, technical configurations and features. In this context, any mode of operation, principle, technical variant and feature disclosed in the Fig. or in the text may be freely and arbitrarily combined with all claims, any feature in the text and in the other Fig., other modes of operation, principles, technical variants and features contained in or resulting from this disclosure, so that all conceivable combinations are attributable to the described approach. Combinations between all individual variants in the text, i.e. in each section of the description, in the claims and also combinations between different variants in the text, in the claims and in the Figs. are also included. The claims also do not limit the disclosure and thus the possible combinations of all disclosed features with each other. All disclosed features are also explicitly disclosed here individually and in combination with all other features.

The invention claimed is:

1. A thermocompression apparatus for connecting electrical components to a substrate, comprising:
   a lower tool with a support surface for supporting the substrate with at least one electrical component arranged thereon, and
   an upper tool with a pressing element facing the support surface of the lower tool, wherein
   the lower tool and the upper tool are movable relative to each other in an open/close movement, wherein
   the lower tool and/or the upper tool are set up,
      to perform the open/close movement by a first drive and a second drive, wherein
         the first drive is arranged to execute a first movement in a first stroke range, the first movement having an acceleration section and a high-speed section and a deceleration section, and
         the second drive is arranged to execute a second movement in a second stroke range, wherein the second movement has an acceleration section and a high-speed section and a deceleration section, and wherein
         a movement speed during the high-speed portion of the first movement is lower than a movement speed during the high-speed portion of the second movement, and
         the first stroke range is greater than the second stroke range, and wherein
   the lower tool or the upper tool carries a thermode assembly which is associated with the support surface and/or the pressing element and which is arranged to feed heating energy into the component and/or the substrate in order to thermally cure an adhesive introduced between the component and the substrate.

2. The thermocompression apparatus according to claim 1, wherein
the first drive is arranged to move the lower tool or the upper tool in the first movement between a first position and a second position, and
the second drive is arranged to move the lower tool or the upper tool in the second movement between the second position and a third position, wherein
the first position is a park position, the second position is an open position, and the third position is a closed position, and/or wherein
the first drive and the second drive are arranged and controlled to execute the first movement and the second movement either consecutively or overlapping in time.

3. The thermocompression apparatus according to claim 1, wherein
the first drive and the second drive are arranged to act in the same direction or in opposite directions to effect the open/close movement of the lower tool and the upper tool.

4. The thermocompression apparatus according to claim 1, wherein
the first drive and the second drive are
both are assigned to the lower tool or the upper tool, or
one of the two drives is assigned to the lower tool and the other of the two drives is assigned to the upper tool.

5. The thermocompression apparatus according to claim 1, wherein
the thermode assembly is arranged and controlled to inject heating energy Into the component and/or the substrate in a temperature range of about 300° C. to about 500° C. during a heating interval of about 0.07 to about 1.5 seconds, or about 0.1 to less than about 1 second, in order to thermally cure the adhesive interposed between the component and the substrate, and/or wherein
the thermode assembly has a contact surface for the heating energy of approximately circular shape and a diameter of less than approximately 5 mm, and/or wherein
the thermode assembly comprises a thermal insulating body which almost completely surrounds a heating element to be energized, wherein at least the contact surface is exposed.

6. The thermocompression apparatus according to claim 1, wherein
a force sensor is assigned to the lower tool and/or the upper tool, which is set up to apply a contact force between the lower tool and the upper tool to the substrate located between them, to the component arranged on the substrate, and to the adhesive introduced between the substrate and the lower tool, and the adhesive introduced between the component and the substrate at least in selected successive closed positions of the lower tool and the upper tool and to signal this to a controller.

7. The thermocompression apparatus according to claim 1, wherein the first drive is configured as a pneumatic or hydraulic cylinder, and the second drive is configured as a plunger coil actuator.

8. The thermocompression apparatus according to claim 6, wherein the first drive and/or the second drive are controlled by the controller in control loop operation during the first movement or the second movement, wherein a force and/or displacement measurement is used to determine a desired quantity, in particular a displacement position of the first drive and/or of the second drive, or respectively a force on the substrate located between them, the component arranged on the substrate, and the adhesive introduced between the component and the substrate.

9. A method of operating a thermocompression apparatus for connecting electrical components to a substrate, comprising the steps of:
placing the substrate with at least one electrical component arranged thereon on a support surface of a lower tool under a pressing element of an upper tool;
moving the lower tool and the upper tool relative to each other in an open/close movement by a first drive and a second drive, wherein
the first drive performs a first movement in a first stroke range, the first movement having an acceleration section and a high-speed section and a deceleration section, and
the second drive performs a second movement in a second stroke range, the second movement having an acceleration section and a high-speed section and a deceleration section, and wherein
a movement speed during the high-speed portion of the first movement is lower than a movement speed during the high-speed portion of the second movement, and
the first stroke range is greater than the second stroke range, and wherein
the lower tool or the upper tool carries a thermode assembly which is associated with the support surface or the pressing element and which is arranged to feed heating energy into the component and/or the substrate during at least part of the open/close movement in order to thermally cure an adhesive introduced between the component and the substrate.

10. The method of operating a thermocompression apparatus according to claim 9, wherein
the first drive moves the lower tool or the upper tool relative to each other in the first movement between a first position and a second position, and the second drive moves the lower tool or the upper tool relative to each other in the second movement between the second position and a third position, wherein preferably
the first position is a park position, the second position is an open position, and the third position is a closed position, and/or wherein
the first drive and the second drive execute the first movement and the second movement either in succession or overlapping in time, and/or wherein
the substrate with the component and the adhesive are conveyed continuously and/or intermittently between the support surface and the pressing element of the lower tool or of the upper tool in the open position of the lower tool and of the upper tool.

11. The method of operating a thermocompression apparatus according to claim 9, wherein
in a first phase, after the first drive has executed the first movement to the extent that the lower tool and the upper tool have moved from the park position into the open position, the second drive begins to execute the second movement so that the lower tool and the upper tool move relative to one another from the open position into the closed position.

12. The method of operating a thermocompression apparatus according to claim 11, wherein
in the acceleration section, the second drive accelerates to execute the second movement until a predetermined first target speed between 100 mm/s and 300 mm/s is reached at which the lower tool and the upper tool move relative to each other from the open position into the closed position.

13. The method of operating a thermocompression apparatus according to claim 11, wherein
in the deceleration section, the second drive for carrying out the second movement until a predetermined second speed, lower than the first set speed between 2 mm/s to and 20 mm/s is reached at which the lower tool and the upper tool move relative to each other from the open position into the closed position.

14. The method of operating a thermocompression apparatus according to claim 13, wherein
in a 2nd phase, which follows the deceleration section of the second movement, while the lower tool and the upper tool move relative to one another from the open position into the closed position in order to determine the component and/or its position on the substrate by touching the component, a drive signal of the second drive is limited to a predetermined maximum value in order, when the pressing element of the upper tool strikes the component, to prevent the component from being pressed against the upper tool, e.g. a control voltage of the plunger coil actuator, is limited to a predetermined maximum value in order not to damage the component when the pressing element of the upper tool hits the component.

15. The method of operating a thermocompression apparatus according to claim 14, wherein
in the 2nd phase, while the lower tool and the upper tool move relative to each other from the open position to the closed position in order to detect the component and/or its position on the substrate, continuously or intermittently adjusting an instantaneous velocity of the lower tool relative to the upper tool is monitored for falling below a threshold value between 1 and 4 orders of magnitude below the second desired velocity, and this falling below the threshold value being evaluated as a contact of the component on the substrate by the upper tool.

16. The method of operating a thermocompression apparatus according to claim 15, wherein
in a 3rd phase, while the lower tool and the upper tool have reached the closed position relative to one another and contact has been made with the component, the drive signal of the second drive is limited during a predetermined pressing time to a predetermined pressing value which is representative of the force with which the component is forced onto the substrate by the adhesive.

17. The method of operating a thermocompression apparatus according to claim 16, wherein
in the 3rd phase, while the lower tool and the upper tool have reached the closed position relative to each other and contact has been made with the component, the control signal of the second drive passes through a predetermined press value-force/time profile during the predetermined press time to change the force with which the component is forced onto the substrate by the adhesive.

18. The method of operating a thermocompression apparatus according to claim 17, wherein
in a 4th phase, after the predetermined pressing time has elapsed, the lower tool and the upper tool move relatively away from each other from the closed position to the open position.

19. The method of operating a thermocompression apparatus according to claim 16, wherein
in the 2nd and 3rd phases, a controller carries out a comparison of the time of touching the component and/or determining its position or height on the substrate with a predetermined displacement or position value after the start of the movement from the open position into the closed position, and in the event of deviation, in particular falling below the predetermined path or position value by more than a predetermined first deviation value, detects an error situation and signals an error message or an interruption request, and/or the control system detects an error situation in the event of deviation, in particular falling below the predetermined travel or position value by less than a second predetermined deviation value, and an error message or an interruption request is signaled, and/or
the control system detects an error situation in the event of deviation, in particular exceeding of the predetermined travel or position value by a predetermined third deviation value, and signals an error message or an interruption request.

20. The method of operating a thermocompression apparatus according to claim 9, wherein
a force sensor detects a contact force between the lower tool and the upper tool on the substrate located between them, the component arranged on the substrate, and the adhesive introduced between the component and the substrate at least in selected successive closed positions of the lower tool and the upper tool and signals this to a controller, and/or wherein
a detection of a contact force after the insertion of the substrate or a portion of the substrate with the component placed thereon and the adhesive inserted therebetween between the lower tool and the upper tool takes place before the movement of the lower tool and the upper tool relative to each other from the open position to the closed position is completed.

21. The method of operating a thermocompression apparatus according to claim 9, wherein
a controller is assigned an indexing register for the substrate in which placement positions of the substrate are to be entered on which a component is arranged or on which no component is arranged, and wherein
the controller reads out from the indexing register the placement positions of the substrate on which a component is placed, and at these placement positions the bonding of the component to the substrate is carried out by curing the adhesive, and/or
the controller reads out from the indexing register the placement positions of the substrate on which no component is placed, and at these placement positions the bonding of the component to the substrate is not carried out by curing the adhesive.

22. The method of operating a thermocompression apparatus according to claim 21, wherein
the controller enters in the indexing register for each of the placement positions,
whether the placement position is without a component,
whether there is adhesive at the placement position,
whether component and adhesive are present at the placement position, and/or
if at least the component is present at the placement position, position of the component as X,Y coordinates and its angle of rotation.

23. The method of operating a thermocompression apparatus according to claim 21, wherein the controller determines and causes that, if the placement position is without a component, the steps for connecting the component to the substrate are not performed, and/or the controller determines and causes, if adhesive is present at the placement position, the lower tool and the upper tool to be moved relative to each other to an intermediate position to cure the adhesive without contact, and/or the controller determines and causes, if the component and adhesive are present at the placement position, the bonding of the component to the substrate to be performed by curing the adhesive.

24. The method of operating a thermocompression apparatus according to claim 21, wherein data to be entered into the indexing register of the control for each of the placement positions, image captures or metadata determined from image captures for adhesive curing, the component position X, Y and the component rotation from a machine module upstream of the apparatus and/or an image capturing inspection system upstream of the apparatus are signaled and processed further in the controller.

25. The method of operating a thermocompression apparatus according to claim 21, wherein image captures or metadata determined from image captures for adhesive curing, the component position X, Y and the component rotation are signaled to the control from an image capturing inspection system downstream of the apparatus, so that these are further processed and/or forwarded to a downstream or higher-level process station.

* * * * *